United States Patent [19]

New

[11] Patent Number: 5,450,022

[45] Date of Patent: Sep. 12, 1995

[54] STRUCTURE AND METHOD FOR CONFIGURATION OF A FIELD PROGRAMMABLE GATE ARRAY

[75] Inventor: Bernard J. New, Los Gatos, Calif.

[73] Assignee: Xilinx Inc., San Jose, Calif.

[21] Appl. No.: 319,756

[22] Filed: Oct. 7, 1994

[51] Int. Cl.6 ............................................. H03K 3/356
[52] U.S. Cl. ......................................... 326/39; 326/8; 326/44
[58] Field of Search ..................... 326/8, 38, 39, 44; 365/275.7

[56] References Cited

U.S. PATENT DOCUMENTS

| Re. 34,363 | 8/1993 | Freeman | 307/465 |
|---|---|---|---|
| 4,124,899 | 11/1978 | Birkner et al. | 364/716 |
| 4,330,852 | 5/1982 | Redwine | 305/221 |
| 4,706,216 | 11/1987 | Carter | 365/94 |
| 4,750,155 | 6/1988 | Hsieh | 365/203 |
| 4,758,745 | 7/1988 | Elgamal et al. | 307/465 |
| 4,821,233 | 4/1989 | Hsieh | 365/203 |
| 4,870,302 | 9/1989 | Freeman | 307/465 |
| 5,140,193 | 8/1992 | Freeman et al. | 326/39 |
| 5,148,390 | 9/1992 | Hsieh | 365/95 |
| 5,198,705 | 3/1993 | Galbraith et al. | 307/465 |
| 5,243,238 | 9/1993 | Kean | 307/465 |
| 5,258,668 | 11/1993 | Cliff | 307/465 |
| 5,260,611 | 11/1993 | Cliff | 307/465 |
| 5,260,881 | 11/1993 | Agrawal et al. | 364/489 |
| 5,267,187 | 11/1993 | Hsieh | 364/784 |
| 5,280,202 | 1/1994 | Chan | 307/465 |
| 5,349,249 | 9/1994 | Chiang et al. | 326/39 X |

FOREIGN PATENT DOCUMENTS

WO93/05577 8/1992 WIPO.

OTHER PUBLICATIONS

Xilinx, Inc. The Programmable Logic Data Book, 1994, pp. 1-1 through 1-7; 2-1 through 2-42; 2-103 through 2-136; and 2-185 through 2-212, available from Xilinx, Inc., 2100 Logic Drive, San Jose, Calif. 95124.

Morales, Luis, "Boundry Scan in XC4000 Devices", XAPP 017.001, Oct. 1992, pp. 2-108 and 2-180.

Primary Examiner—David R. Hudspeth
Attorney, Agent, or Firm—Edel M. Young; E. Eric Hoffman

[57] ABSTRACT

A structure and method for configuring a field programmable gate array (FPGA). A configuration memory cell within the FPGA receives a programming signal. In response, the configuration memory cell provides a signal to a configuration control circuit to configure the FPGA. The configuration memory cell includes an input lead, a storage device and a selectable configuration circuit. The input lead carries the programming signal to the storage device. The storage device stores the programming signal and an inverted programming signal which is the inverse of the programming signal. The selectable configuration circuit can be selectably configured to provide the programming signal or the inverted programming signal to a first input lead of the configuration control circuit. The configuration control circuit couples (or decouples) various elements of the FPGA in response to the signal provided on the first input lead.

In an alternate embodiment, the selectable configuration circuit is coupled between the input lead and the storage device. Again, the selectable configuration circuit can be selectably configured to provide the programming signal or the inverted programming signal to the first input lead of the configuration control circuit.

26 Claims, 7 Drawing Sheets

STRUCTURE AND METHOD FOR CONFIGURATION OF A FIELD PROGRAMMABLE GATE ARRAY

BACKGROUND OF THE INVENTION

1. Field of the Invention

The present invention relates to a structure and method for configuring a field programmable gate array (FPGA).

2. Description of the Prior Art

An FPGA typically includes configuration memory cells, configuration control elements and a matrix of logic blocks and I/O blocks. To create a desired circuit, the user writes a data bit to each of the configuration memory cells. The configuration control elements are configured in response to the data bits stored in configuration memory cells. The user selects the data bits such that the configuration control elements properly configure the logic and I/O blocks to form the circuitry required by the user's design.

FIG. 1 is a schematic diagram of a prior art configuration memory cell 100 and an associated configuration control element 110. Configuration memory cell 100 includes programming transistor 101 and inverters 102 and 103. Configuration memory cell 100 is programmed using means external to the FPGA. In programming configuration memory cell 100, an enable (EN) signal is provided to the gate of transistor 101 on lead 106 and a programming (PRG) signal is provided to the source of transistor 101 on lead 107. The PRG signal is thereby transmitted through transistor 101 and stored in the latch formed by inverters 102 and 103. After the PRG signal is stored by inverters 102 and 103, the EN signal is de-asserted. As a result, the PRG signal is provided to configuration control circuit 110 on lead 104 and the inverse of the PRG signal ($\overline{PRG}$) is provided to configuration control circuit 110 on lead 105. In response, configuration control circuit 110 provides (or prevents) an interconnection between other elements (such as logic and/or I/O blocks) in the FPGA.

The PRG signal used to program configuration memory cell 100 is a bit which is typically stored in an EEPROM, EPROM, ROM, floppy disk or hard disk which is part of the external programming means. A conventional FPGA may contain thousands of configuration memory cells like configuration memory cell 100. Programming all of these configuration memory cells requires thousands of bits. These bits are all loaded by the external programming means. When the FPGA is configured, the external programming means transmits the required bits to the FPGA in the form of a bit stream. Because this bit stream travels along a physical path from the external programming means to the FPGA, the bit stream can be accessed fairly easily by tapping into this physical path. Although copyright protection may be obtained for the bit stream, an unscrupulous copyist can nonetheless reproduce the user's device by recording the bit stream, reproducing the bit stream, and applying the bit stream to an identical FPGA. The copyist can generally obtain an identical FPGA "off the shelf" because, within a product line, FPGA's are typically manufactured in a generic manner.

Because the costs associated with designing the configuration of an FPGA-based device are significant, it would be desirable to have an FPGA which is more difficult to copy, without substantially adding to the complexity of the FPGA.

SUMMARY OF THE INVENTION

Accordingly, the present invention provides a structure and method for configuring a field programmable gate array (FPGA). In one embodiment of the invention, a programming signal is transmitted to a configuration memory cell within the FPGA. In response, the configuration memory cell provides a signal to a configuration control circuit which is used to configure the FPGA. The configuration memory cell includes an input lead, a storage device and a selectable configuration circuit. The input lead carries the programming signal to the storage device. The storage device stores the programming signal and the inverse of the programming signal. The selectable configuration circuit is coupled to the storage device. The selectable configuration circuit can be selectably configured to provide the programming signal or the inverted programming signal to a first input lead of the configuration control circuit. The configuration control circuit couples (or decouples) various elements of the FPGA in response to the signal provided on the first input lead.

In an alternate embodiment, the selectable configuration circuit is coupled between the input lead and the storage device. Again, the selectable configuration circuit can be selectably configured to provide the programming signal or the inverted programming signal to the first input lead of the configuration control circuit.

The above described configuration memory cells provide several advantages. In one embodiment, all of the selectable configuration circuits of the FPGA are selectably configured such that the FPGA is placed in the desired configuration when all of the programming signals are at logic low level. In such an embodiment, the FPGA is internally programmed by connecting all of the configuration memory cells to a logic low signal during start up of the FPGA.

In an alternate embodiment, the selectable configuration circuits of an FPGA are randomly fabricated to have either a first or a second configuration. The random order of the selectable configuration circuits is user specific. That is, the FPGAs utilized by a particular user are identical, with each FPGA having the same random order of selectable configuration circuits. The order of the selectable configuration circuits is known only to the user, and only the user can readily obtain an FPGA having the particular random order of selectable configuration circuitry. Thus, while the user still provides a bit stream to program the FPGA, this bit stream will only properly program FPGA's available to the user. In this manner, the invention provides an additional level of security within the FPGA.

The invention will be more fully understood in view of the following drawings taken together with the detailed description.

DETAILED DESCRIPTION OF THE INVENTION

Figure 1:
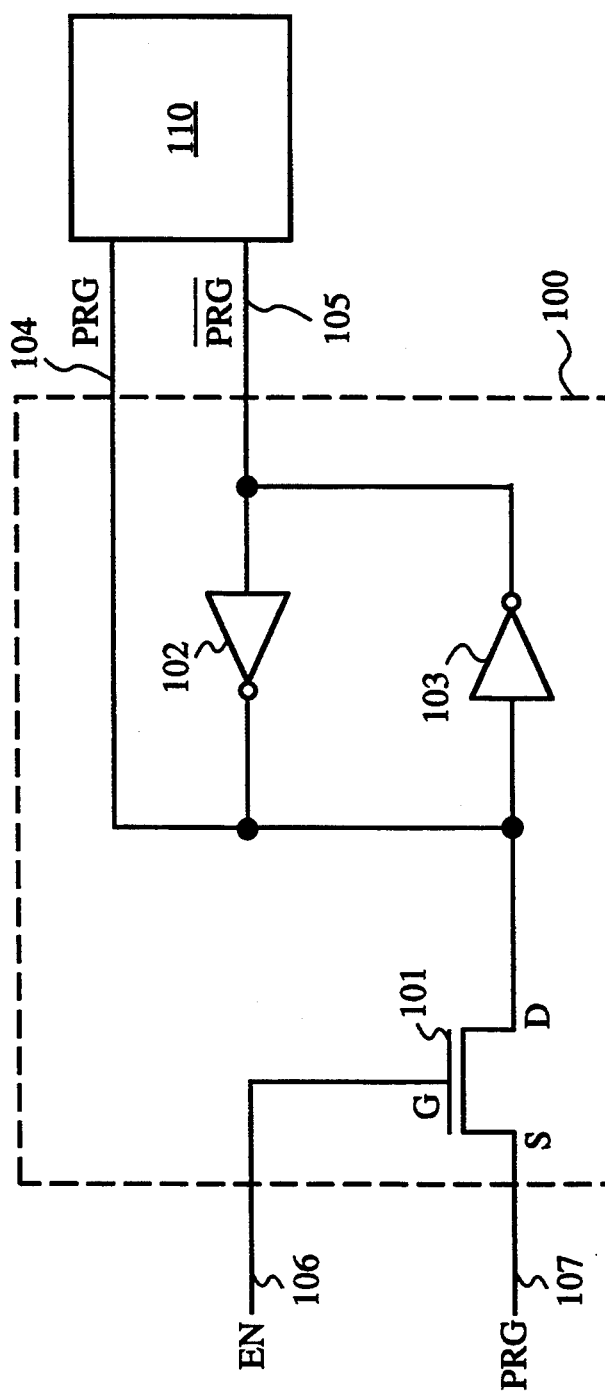
FIG. 1 is a schematic diagram of a prior art FPGA configuration memory cell.
Figure 2:
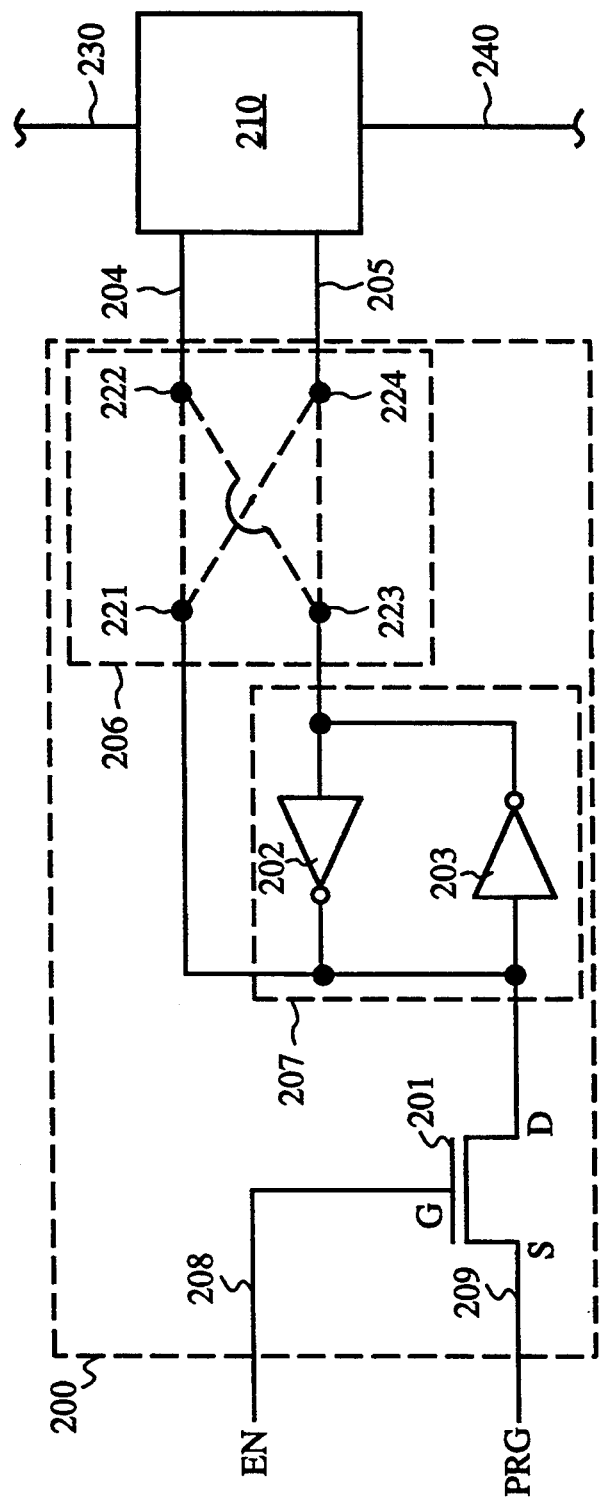
FIG. 2 is a schematic diagram of an FPGA configuration memory cell in accordance with one embodiment of the invention.

FIG. 2 is a schematic diagram of a configuration memory cell 200 in accordance with one embodiment of the invention. Configuration memory cell 200 includes transistor 201, inverters 202 and 203 and selectable configuration circuit 206. The gate of transistor 201 receives an enable (EN) signal from a programming device on lead 208. The source of transistor 201 receives a programming (PRG) signal from the programming device on lead 209. The PRG signal is a bit having either a logic high or a logic low value. To program configuration memory cell 200, the EN signal is asserted high. The high EN signal turns on transistor 201, thereby allowing the PRG signal to be transmitted through transistor 201 to the latch 207 formed by inverters 202 and 203. In one embodiment, inverters 202 and 203 are conventional CMOS inverters. Latch 207 stores the PRG signal even after the EN signal is de-asserted low.

Latch 207 is coupled to selectable configuration circuitry 206. Selectable configuration circuitry 206 includes nodes 221-224. Latch 207 provides the PRG signal to node 221. Similarly, latch 207 provides the inverse of the programming signal ($\overline{PRG}$) to node 223. Conductive paths are selectively formed to connect nodes 221 and 223 to nodes 222 and 224 in one of two configurations.

In a first configuration, an electrically conductive path connects nodes 221 and 222, and another conductive path connects nodes 223 and 224. In this first configuration, the PRG signal is provided to node 222 and the $\overline{PRG}$ signal is provided to node 224. Consequently, the PRG and $\overline{PRG}$ signals are provided to input leads 204 and 205, respectively, of configuration control circuit 210.

In a second configuration, a conductive path is formed between nodes 221 and 224, and another conductive path is formed between nodes 223 and 222. In this configuration, the signal is provided to node 222 and the $\overline{PRG}$ signal is provided to node 224. Consequently, the PRG and $\overline{PRG}$ signals are provided to input leads 205 and 204, respectively, of configuration control circuit 210.

Because the first and second configurations transpose the manner in which the PRG and $\overline{PRG}$ signals are provided to configuration control circuit 210, the response of the configuration control circuit 210 is dependent upon the configuration of selectable configuration circuit 206. As described in more detail below, configuration control circuit 210 provides a first response when selectable configuration circuit 206 is in the first configuration, and a second response, which is opposite to the first response, when selectable configuration circuit 206 is in the second configuration.

The signals on nodes 222 and 224 are provided to configuration control circuit 210 on leads 204 and 205, respectively. Configuration control circuit 210 is a conventional circuit which is responsive to the signals on leads 204 and 205. In one embodiment, configuration control circuit 210 is a transmission gate that controls the interconnection of segments 230 and 240 of the FPGA.

Figure 3:
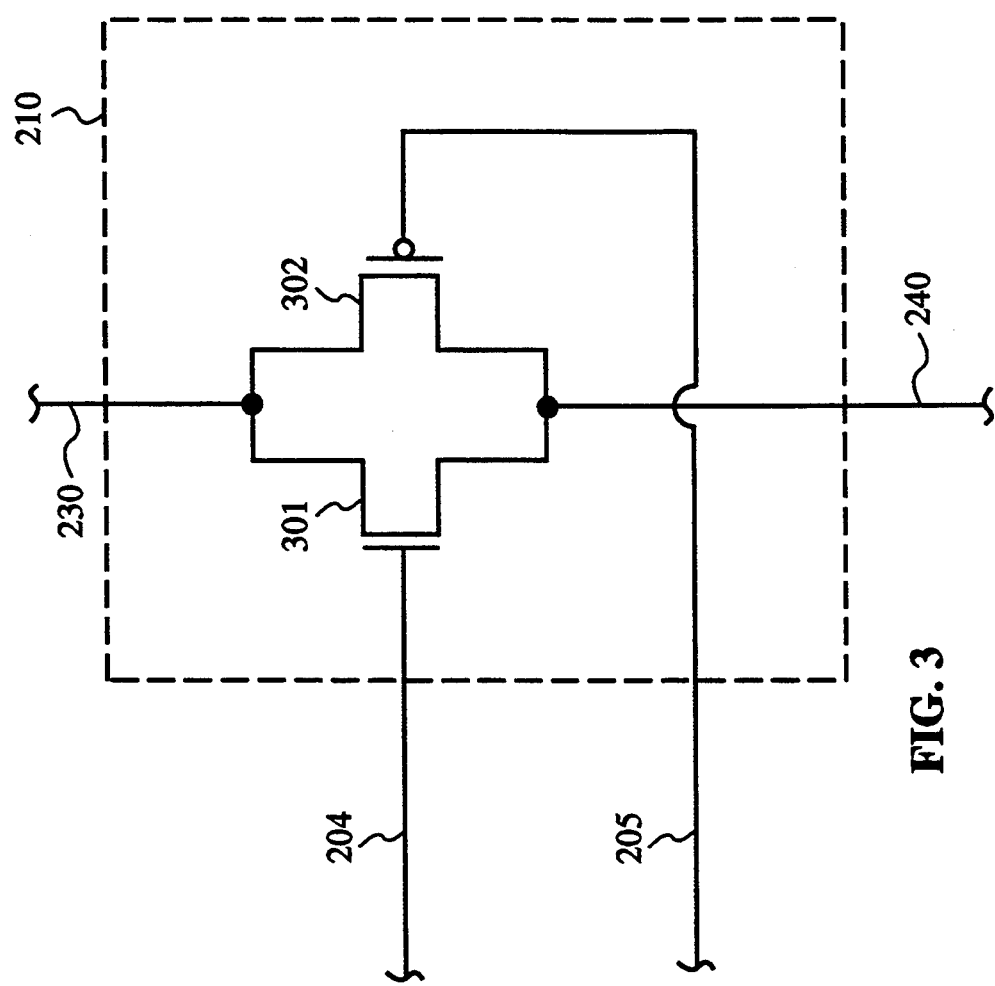
FIG. 3 is a schematic diagram of one embodiment of the configuration control circuit of FIG. 2.

FIG. 3 is a schematic diagram of an embodiment in which configuration control circuit 210 is a transmission gate formed by n-channel transistor 301 and p-channel transistor 302. The gate of n-channel transistor 301 is connected to lead 204 and the gate of p-channel transistor 302 is connected to lead 205. Consequently, if selectable configuration circuitry 206 has the first configuration described above (i.e., the PRG signal applied to lead 204 and the $\overline{PRG}$ signal applied to lead 205), a logic high PRG signal causes transistors 301 and 302 to turn on, thereby connecting routing segments 230 and 240. Routing segments 230 and 240 connect logic blocks and other circuitry within the FPGA.

Conversely, if selectable configuration circuitry 206 has the previously described second configuration (i.e., the $\overline{PRG}$ signal applied to lead 204 and the PRG signal applied to lead 205), a logic high PRG signal causes transistors 301 and 302 to turn off, thereby isolating interconnect routing segments 230 and 240.

By controlling the configuration of memory cell 200, several advantages are obtained. As previously discussed, each FPGA may contain thousands of configuration memory cells which must be programmed from an external programming source to properly configure the FPGA. However, in accordance with the invention, the configuration memory cells may be programmed internally when the FPGA is powered-up. To accomplish this, the selectable configuration circuitry of each configuration memory cell in the FPGA is fabricated such that when a low PRG signal is applied to the associated configuration control circuit, the configuration control circuit is placed in the desired configuration. During power-up of the FPGA, the EN signal is asserted high and the PRG signal provided to each configuration memory cell is de-asserted low, resulting in the desired FPGA configuration.

For example, if the desired FPGA configuration requires that transistors 301 and 302 (FIG. 3) are turned off to disconnect segments 230 and 240, the selectable configuration circuitry 206 is fabricated such that node 221 is connected to node 222 and such that node 223 is connected to node 224. When a low PRG signal is applied to latch 207 via transistor 201, a low signal is applied to lead 204 and a high signal is applied to lead 205. As a result, transistors 301 and 302 are turned off to provide the desired configuration.

In the above-described embodiment, even though the FPGA is placed in a default configuration when logic low PRG signals are provided to the configuration memory cells, the FPGA remains programmable. To create a different configuration, an external bit stream is used to program the configuration memory cells of the FPGA. This bit stream includes logic high signals which are provided to the configuration memory cells which are to be reprogrammed and logic low signals which are provided to the configuration memory cells which are to remain unchanged.

In a variation of the invention, the selectable configuration circuits of the configuration memory cells of an FPGA are randomly fabricated to have either the first or second configuration. The random order of the selectable configuration circuits is user specific. That is, the FPGAs utilized by a particular user are identical, with each FPGA having the same random order of selectable configuration circuits. The order of the selectable configuration circuits is known only to the user.

The user still provides a bit stream to program the FPGA. However, this bit stream will only properly program an FPGA which has the random order of selectable configuration circuitry found on the user's FPGA. Consequently, a copyist can no longer replicate the user's device by copying the bit stream provided to the user's FPGA, buying an identical, conventional FPGA off the shelf, and programming the conventional FPGA by reproducing the user's bit stream. Thus, the invention provides an additional level of security within the FPGA.

Selectable configuration circuit 206 can be realized in a number of different ways. In one embodiment, the interconnection of selectable configuration circuit 206 is determined by appropriately patterning the masks which are used to fabricate the interconnects between latch 207 and configuration control circuit 210.

In an alternate embodiment, the masks which are used to fabricate the interconnects between latch 207 and configuration control circuit 210 are patterned to provide connections between nodes 221 and 223, nodes 221 and 224, nodes 222 and 223, and nodes 222 and 224. A laser is then used in accordance with conventional techniques to eliminate the undesired connections. The lasing may be performed by the manufacturer or designer of the FPGA.

In yet other embodiments, conventional programmable fuses, EPROM cells or EEPROM cells are fabricated between nodes 221 and 223, nodes 221 and 224, nodes 222 and 223, and nodes 222 and 224. These elements are then programmed using conventional methods to form the desired connections between nodes 221–224.

Figure 4:
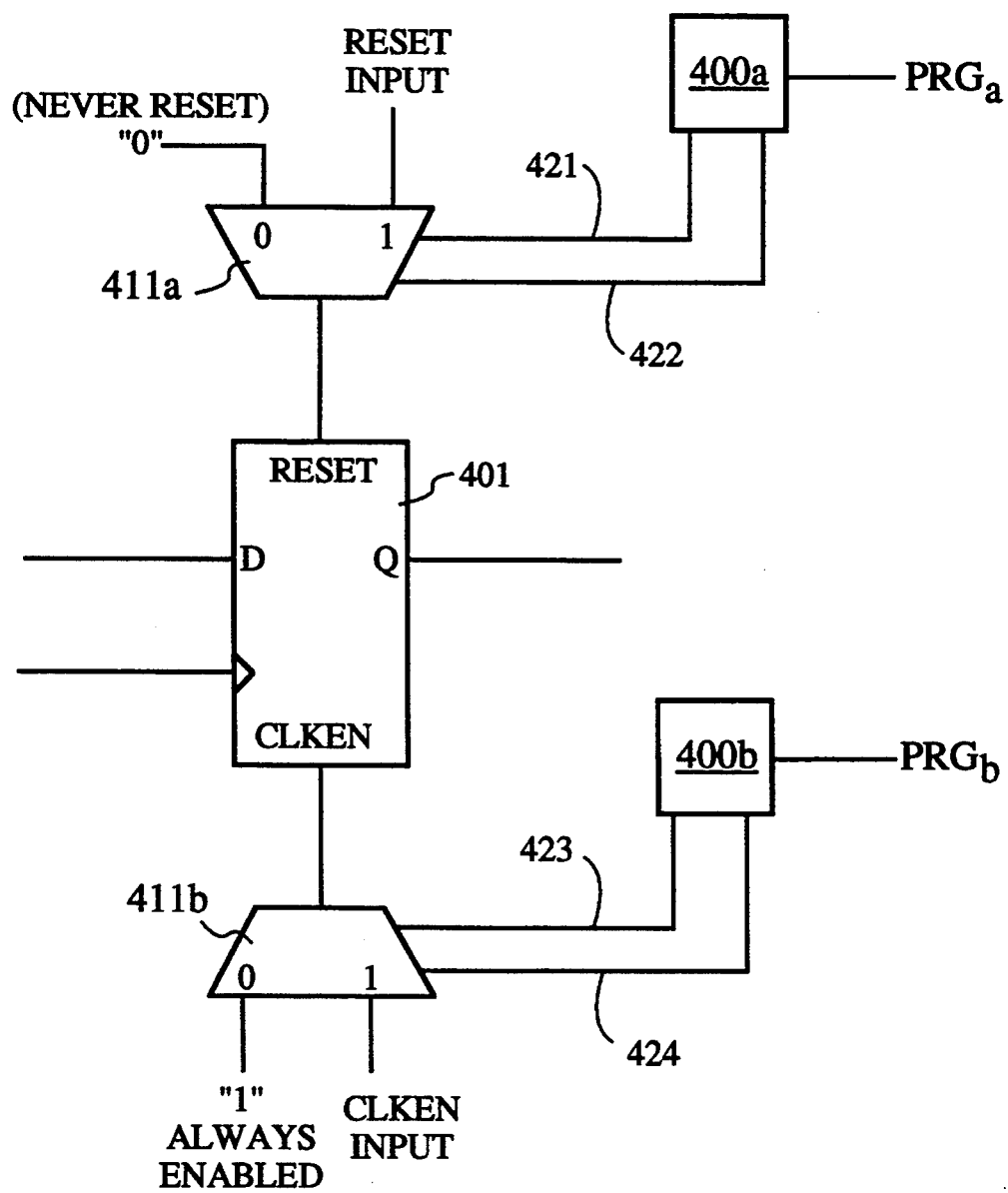
FIGS. 4-6 are schematic diagrams illustrating various applications of configuration memory cells and configuration control circuits of the invention.

FIG. 4 is a schematic diagram illustrating another application of the invention. Configuration memory cells 400a and 400b control the configuration of multiplexers 411a and 411b, respectively. Configuration memory cells 400a and 400b are similar to configuration memory cell 200 (FIG. 2). Leads 421 and 422 connect the output terminals of configuration memory cell 400a to the control input terminals of multiplexer 411a. When configuration memory cell 400a provides a logic low signal on lead 421 and a logic high signal on lead 422, a logic low signal is transmitted through multiplexer 411a to the reset input terminal of flip flop 401. Consequently, flip flop 401 is operated such that the flip flop 401 is not reset.

Conversely, when configuration memory cell 400a provides a logic high signal on lead 421 and a logic low signal on lead 422, a RESET input signal is transmitted through multiplexer 411a to the reset input terminal of flip flop 401. The RESET input signal controls whether flip flop 401 is reset.

In a similar manner, configuration memory cell 400b controls the signal provided to the clock enable (CLKEN) input terminal of flip flop 401. When a logic low signal is provided to lead 423 and a logic high signal is provided to lead 424, the signal provided to the CLKEN input of flip flop 401 is a logic high signal. In this case, flip flop 401 is always enabled. When a logic high signal is provided to lead 423 and a logic low signal is provided to lead 424, a CLKEN input signal is provided to the CLKEN input terminal of flip flop 401.

Figure 5:
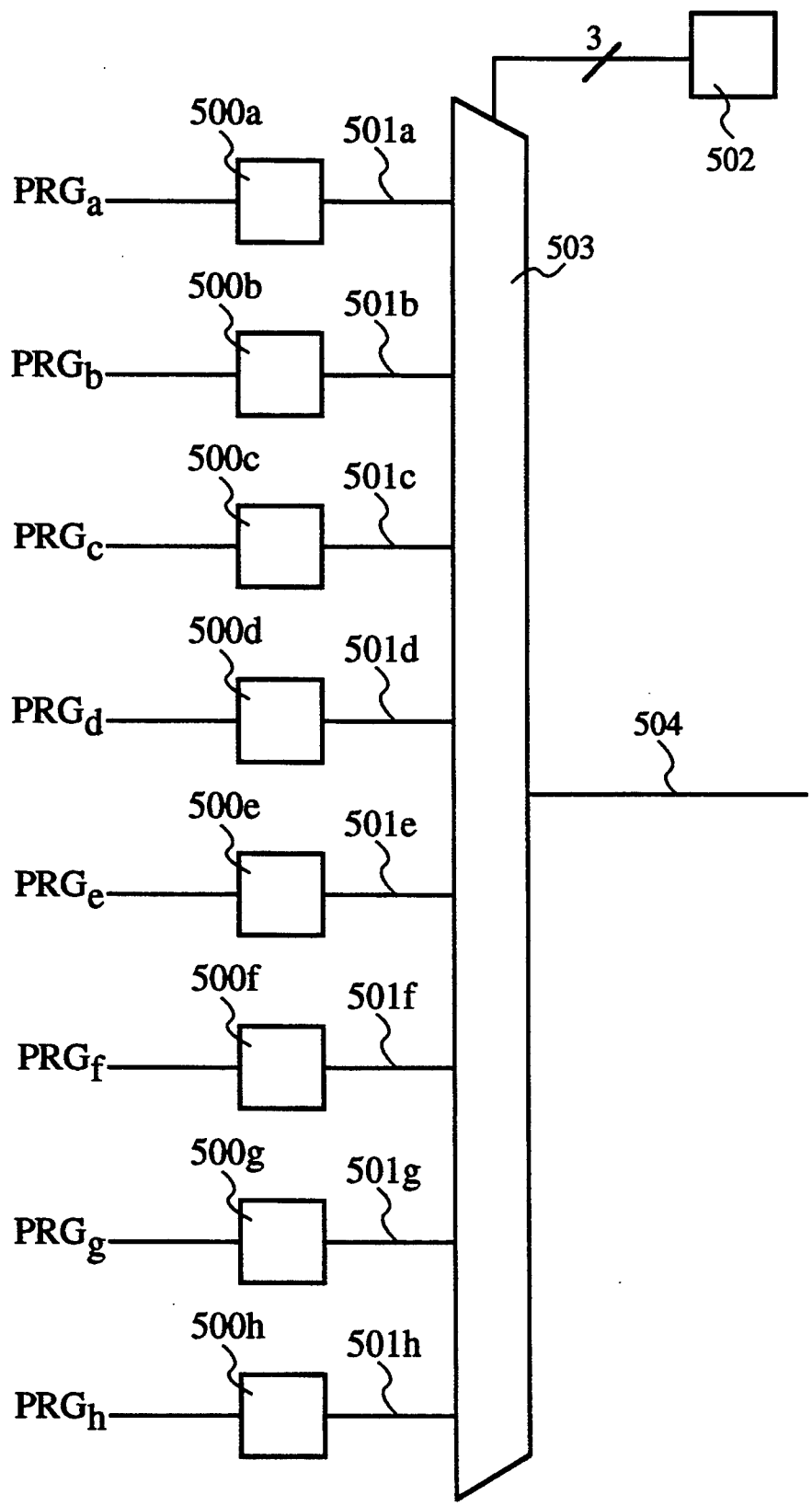

In another application, configuration memory cells and configuration control circuits in accordance with the invention are used to create a ROM look up table. FIG. 5 is a schematic diagram of an 8-bit ROM look up table which utilizes configuration memory cells 500a–500h. Configuration memory cells 500a–500h are similar to configuration memory cell 200 (FIG. 2). Output leads 501a–501h couple one of the output terminals of configuration memory cells 500a–500h to input terminals of 8-to-1 multiplexer 503. Configuration memory cells 500a–500h are programmed such that the output leads 501a–501h carry a logic high or a logic low signal, depending upon the desired look up table values. Multiplexer 503 connects the output terminal of one of configuration control circuits 510a–510h to output terminal 504 in response to a 3-bit control signal received from function generator 502. Although this application has been described in connection with an 8-bit look up table, it is understood that this application is easily modified to include look up tables having other numbers of bits.

Figure 6:
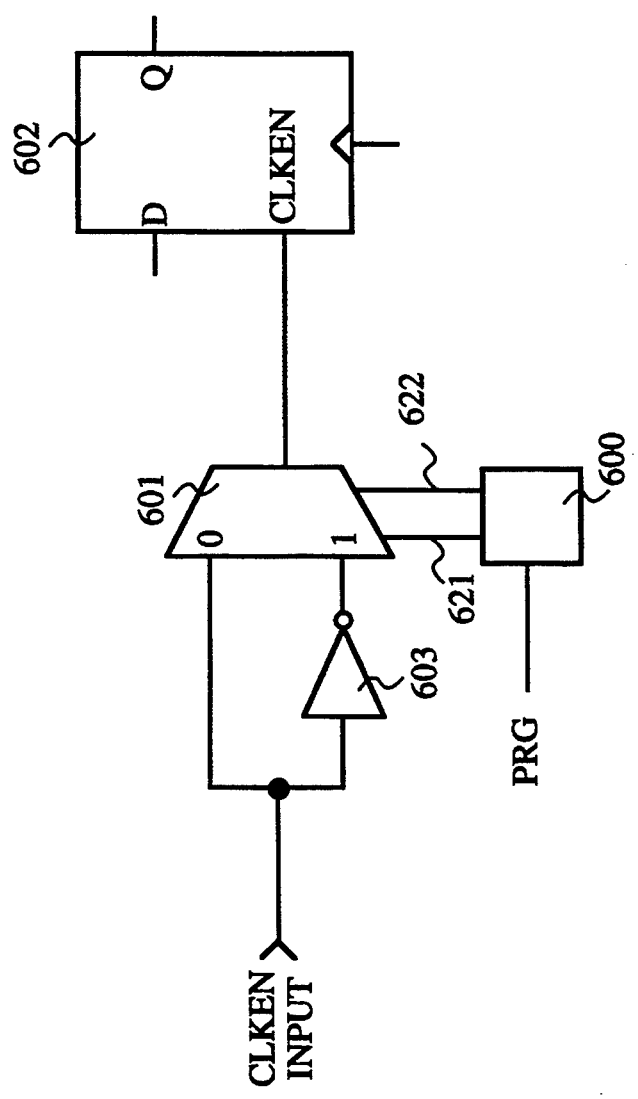

In yet another application, a configuration memory cell and configuration control circuit of the invention can be used to control whether signals within the FPGA will be interpreted as active-high or active-low. FIG. 6 is a schematic diagram illustrating how configuration memory cell 600 can be used to control the active-high/active-low status of a CLKEN input signal. Leads 621 and 622 connect the output terminals of configuration memory cell 600 to the control terminals of multiplexer 601. When configuration memory cell 600 is programmed such that a logic low signal is provided on lead 621 and a logic high signal is provided on lead 622, the CLKEN input signal is transmitted through multiplexer 601 to the CLKEN input terminal of flip flop 602. In this configuration, the CLKEN input signal is active-high.

Conversely, when configuration memory cell 600 is programmed to provide a logic high signal on lead 621 and a logic low signal on lead 622, the CLKEN input signal is inverted by inverter 603, and passed through multiplexer 601 to the CLKEN input terminal of flip flop 602. In this configuration, the CLKEN input signal is active-low.

Figure 7:
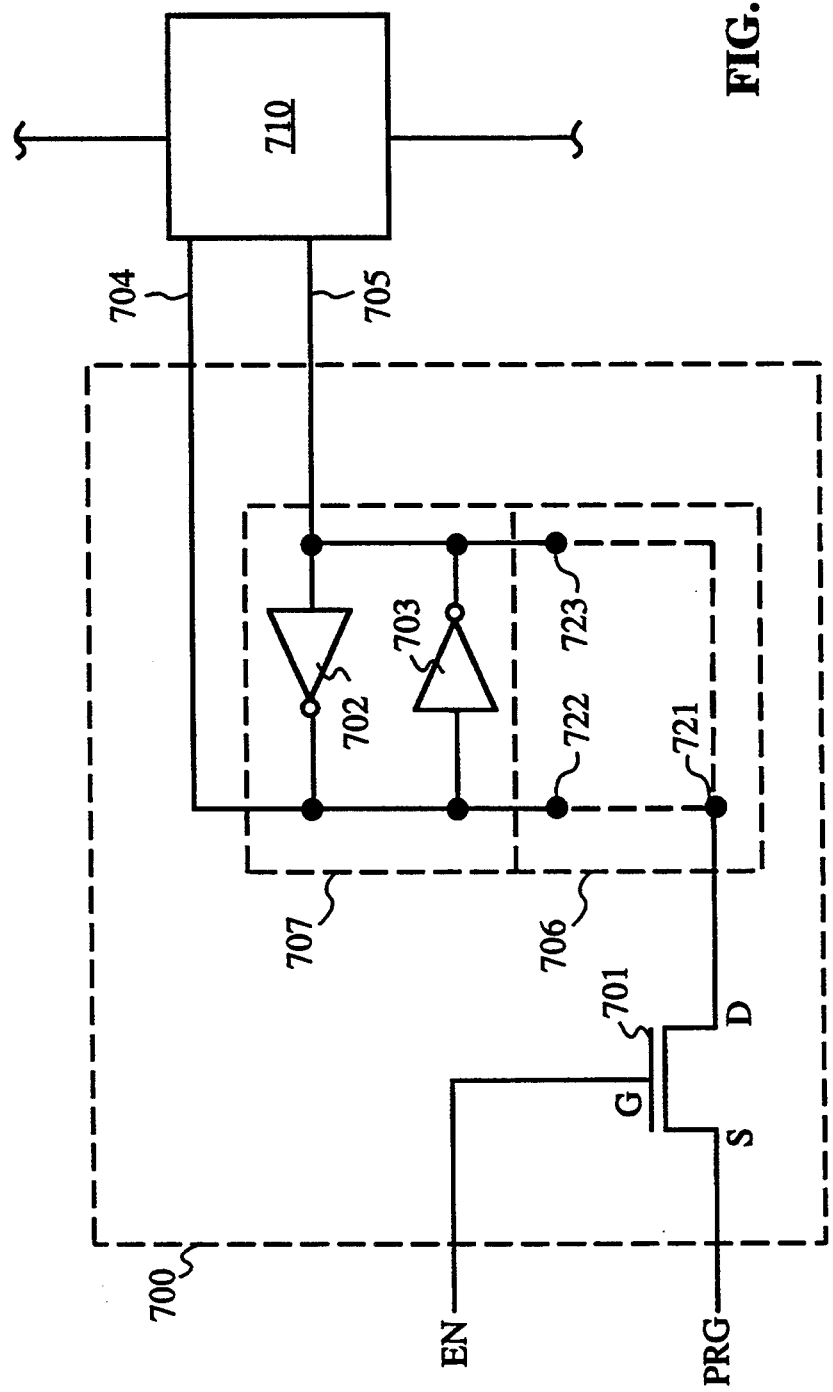
FIG. 7 is a schematic diagram of an FPGA configuration memory cell in accordance with another embodiment of the invention.

FIG. 7 is a schematic diagram of a configuration memory cell 700 in accordance with the invention. Configuration memory cell 700 includes transistor 701, inverters 702 and 703 and selectable configuration circuit 706. Configuration memory cell 700 operates in a manner similar to configuration memory cell 200. However, selectable configuration circuit 706 is connected between transistor 701 and the latch 707 formed by inverters 702 and 703.

Selectable configuration circuit 706 is connected in one of two configurations. In a first configuration, node 721 is connected to node 722. In this configuration, the PRG signal transmitted through transistor 701 to latch 707 is provided to configuration control circuit 710 on lead 704 and the signal is provided to configuration control circuit 710 on lead 705.

In a second configuration, node 721 is connected to node 723. In this configuration, the PRG and $\overline{\text{PRG}}$ signals are transmitted to configuration control circuit 710 on leads 704 and 705, respectively.

Configuration memory cell 700 can be fabricated in accordance with any of the methods previously described in connection with configuration memory cell 200.

While the invention has been described in connection with particular embodiments, it is understood that the invention is not limited to the embodiments disclosed, but is capable of various modifications which would be apparent to one of ordinary skill in the art. Thus, the invention is limited only by the following claims.

I claim:

1. A configuration memory cell for programming a configuration control circuit having a first input lead, said configuration memory cell comprising:
   an input lead which receives a programming signal;
   a storage device coupled to said input lead, wherein said storage device stores said programming signal and an inverted programming signal which is the inverse of said programming signal;
   a selectable configuration circuit coupled between said storage device and said first input lead of said configuration control circuit, wherein said selectable configuration circuit can be selectably configured to transmit said programming signal or said inverted programming signal to said first input lead of said configuration control circuit.

2. The configuration memory cell of claim 1, further comprising a transistor connected between said input lead and said storage device, wherein said transistor passes said programming signal to said storage device in response to an enabling signal.

3. The configuration memory cell of claim 1, wherein said storage device is non-volatile.

4. The configuration memory cell of claim 1, wherein said storage device comprises:
   a first node coupled to said input lead;
   a second node;
   a first inverter having an input conductor coupled to said first node and an output conductor coupled to said second node; and
   a second inverter having an input conductor coupled to said second node and an output conductor coupled to said first node.

5. The configuration memory cell of claim 4, wherein said selectable configuration circuit comprises:
   means for selectably connecting said first node or said second node to said first input lead of said configuration control circuit.

6. The configuration memory cell of claim 1, wherein said selectable configuration circuit is mask programmable.

7. The configuration memory cell of claim 1, wherein said selectable configuration circuit comprises programmable fuses.

8. The configuration memory cell of claim 1, wherein said selectable configuration circuit comprises programmable EPROM cells.

9. The configuration memory cell of claim 1, wherein said selectable configuration circuit comprises programmable EEPROM cells.

10. The configuration memory cell of claim 1, wherein said configuration control circuit has a second input lead, said selectable configuration circuit being coupled between said storage device and said second input lead of said configuration control circuit, wherein said selectable configuration circuit can be selectably configured to transmit said programming signal or said inverted programming signal to said second input lead of said configuration control circuit.

11. The configuration memory cell of claim 10, wherein said storage device comprises:
   a first node coupled to said input lead;
   a second node;
   a first inverter having an input conductor coupled to said first node and an output conductor coupled to said second node; and
   a second inverter having an input conductor coupled to said second node and an output conductor coupled to said first node.

12. The configuration memory cell of claim 11, wherein said selectable configuration circuit comprises:
   means for selectably connecting said first node or said second node to said first input lead of said configuration control circuit; and
   means for selectably connecting said first node or said second node to said second input lead of said configuration control circuit.

13. A configuration memory cell for programming a configuration control circuit having a first input lead, said configuration memory cell comprising:
   an input lead which receives a programming signal;
   a storage device coupled to said first input lead of said configuration control circuit,
   a selectable configuration circuit coupled between said input lead and said storage device, wherein said selectable configuration circuit can be selectably configured such that said storage device stores said programming signal or an inverted signal which is the inverse of said programming signal.

14. The configuration memory cell of claim 13, further comprising a transistor coupled between said input lead and said selectable configuration circuit, wherein said transistor passes said programming signal to said selectable configuration circuit in response to an enabling signal.

15. The configuration memory cell of claim 13, wherein said storage device is non-volatile.

16. The configuration memory cell of claim 13, wherein said storage device comprises:
   a first node coupled to said first input lead of said configuration control circuit;
   a second node;
   a first inverter having an input conductor coupled to said first node and an output conductor coupled to said second node; and
   a second inverter having an input conductor coupled to said second node and an output conductor coupled to said first node.

17. The configuration memory cell of claim 16, wherein said selectable configuration circuit comprises:
   means for selectably coupling said input lead to said first node or said second node of said storage device.

18. The configuration memory cell of claim 13, wherein said configuration control circuit has a second input lead, wherein said selectable configuration circuit can be selectably configured to provide said programming signal or said inverted programming signal to said second input lead of said configuration control circuit.

19. The configuration memory cell of claim 18, wherein said storage device comprises:
   a first node coupled to said first input lead of said configuration control circuit;
   a second node coupled to said second input lead of said configuration control circuit;
   a first inverter having an input conductor coupled to said first node and an output conductor coupled to said second node; and
   a second inverter having an input conductor coupled to said second node and an output conductor coupled to said first node.

20. The configuration memory cell of claim 19, wherein said selectable configuration circuit comprises:

means for selectably connecting said input lead to said first node or said second node of said storage device.

21. The configuration memory cell of claim 13, wherein said selectable configuration circuit is mask programmable.

22. The configuration memory cell of claim 13, wherein said selectable configuration circuit comprises programmable fuses.

23. The configuration memory cell of claim 13, wherein said selectable configuration circuit comprises programmable EPROM cells.

24. The configuration memory cell of claim 13, wherein said selectable configuration circuit comprises programmable EEPROM cells.

25. A method of configuring a field programmable gate array comprising the steps of:
transmitting a plurality of identical programming signals to a corresponding plurality of selectable configuration circuits;
configuring each of said plurality of selectable configuration circuits in a first configuration or a second configuration;
transmitting a first signal pair through said selectable configuration circuits which have said first configuration;
transmitting a second signal pair, opposite said first signal pair, through said selectable configuration circuits which have said second configuration; and
configuring said field programmable gate array in response to said first and second signal pairs.

26. A method of configuring a field programmable gate array comprising the steps of:
randomly configuring each of a plurality of selectable configuration circuits in a first configuration or a second configuration, wherein said selectable configuration circuits having said first configuration provide a first signal pair in response to a programming signal and said selectable configuration circuits having said second configuration provide a second signal pair in response to said programming signal, said second signal pair being opposite to said first signal pair;
transmitting a corresponding plurality of programming signals to said plurality of selectable configuration circuits; and
configuring said field programmable gate array in response to the first and second signal pairs provided by said selectable configuration circuits.

* * * * *

UNITED STATES PATENT AND TRADEMARK OFFICE
CERTIFICATE OF CORRECTION

PATENT NO. : 5,450,022

DATED : September 12, 1995

INVENTOR(S) : Bernard J. New

It is certified that error appears in the above-identified patent and that said Letters Patent is hereby corrected as shown below:

Title Page, item [56]:
In References Cited, "4,330,852 5/1982 Redwine 305/221" should read
--4,330,852 5/1982 Redwine et al. 365/221--.

In References Cited, "5,280,202 1/1994 Chan" should read
--5,280,202 1/1994 Chan et al.--.

In References Cited, "5,267,187 11/1993 Hsieh" should read
5,267,187 11/1993 Hsieh et al.--.

In References Cited, "5,258,668 11/1993 Cliff" should read
--5,258,668 11/1993 Cliff et al.--.

In References Cited "5,260,611 11/1993 Cliff" should read
--5,260,611 11/1993 Cliff et al.--.

Col. 3, line 48, "the $\overline{PRG}$ signal" should read --the PRG signal--.

Signed and Sealed this

Ninth Day of July, 1996

Attest:

BRUCE LEHMAN

*Attesting Officer*    *Commissioner of Patents and Trademarks*